(12) United States Patent
Du et al.

(10) Patent No.: US 9,608,586 B2
(45) Date of Patent: Mar. 28, 2017

(54) VOLTAGE-TO-CURRENT CONVERTER

(71) Applicant: QUALCOMM Incorporated, San Diego, CA (US)

(72) Inventors: Li Du, San Diego, CA (US); Sang Min Lee, San Diego, CA (US); Dongwon Seo, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 0 days.

(21) Appl. No.: 14/639,553

(22) Filed: Mar. 5, 2015

(65) Prior Publication Data

US 2016/0094195 A1    Mar. 31, 2016

Related U.S. Application Data

(60) Provisional application No. 62/055,516, filed on Sep. 25, 2014.

(51) Int. Cl.
*H03G 3/30* (2006.01)
*H03F 1/02* (2006.01)
*H03F 3/193* (2006.01)
*H03F 3/21* (2006.01)
*H03K 5/24* (2006.01)
*G05F 1/56* (2006.01)

(52) U.S. Cl.
CPC .......... *H03G 3/3042* (2013.01); *G05F 1/561* (2013.01); *H03F 1/0233* (2013.01); *H03F 3/193* (2013.01); *H03F 3/21* (2013.01); *H03K 5/24* (2013.01); *H03F 2200/21* (2013.01); *H03F 2200/252* (2013.01); *H03F 2200/451* (2013.01)

(58) Field of Classification Search
CPC . H03F 1/30; H03F 1/3241; H03F 1/56; H03F 1/223; H03F 3/45179; H03F 3/45475; H03G 1/0088; H03G 3/001
USPC ....... 327/103, 215, 218, 337, 517, 552, 553, 327/554
See application file for complete search history.

(56) References Cited

U.S. PATENT DOCUMENTS

| | | | |
|---|---|---|---|
| 2011/0304376 A1 | 12/2011 | Utsunomiya | |
| 2012/0206161 A1 | 8/2012 | Chang et al. | |
| 2012/0326696 A1* | 12/2012 | Chang ..................... | G05F 1/575 323/313 |
| 2013/0193874 A1 | 8/2013 | Takahashi et al. | |
| 2013/0234685 A1* | 9/2013 | Thoka ..................... | G05F 1/561 323/282 |
| 2014/0043099 A1 | 2/2014 | Igarashi et al. | |
| 2014/0166856 A1 | 6/2014 | Kato et al. | |

(Continued)

OTHER PUBLICATIONS

International Search Report and Written Opinion—PCT/US2015/051893—ISA/EPO—Nov. 25, 2015.

*Primary Examiner* — John Poos
(74) *Attorney, Agent, or Firm* — Procopio, Cory, Hargreaves & Savitch, LLP

(57) ABSTRACT

A converter including: an amplifier having first and second input terminals and an output terminal, the first input terminal configured to receive a reference voltage; an array of resistors configured to generate a tuning voltage; and a first plurality of switches coupled to the second input terminal of the amplifier and the array of resistors, the first plurality of switches configured to adjust a gain of the amplifier by selecting at least one resistor in the array of resistors to connect to the second input terminal of the amplifier.

17 Claims, 8 Drawing Sheets

(56) References Cited

U.S. PATENT DOCUMENTS

2014/0184278 A1 7/2014 Zeng
2014/0191796 A1 7/2014 Yoshizawa

* cited by examiner

US 9,608,586 B2

VOLTAGE-TO-CURRENT CONVERTER

CROSS-REFERENCE TO RELATED APPLICATIONS

This application claims the benefit of priority under 35 U.S.C. §119(e) of co-pending U.S. Provisional Patent Application No. 62/055,516, filed Sep. 25, 2014, entitled "Voltage-to-Current Converter." The disclosure of the above-referenced application is incorporated herein by reference.

BACKGROUND

Field

This invention relates generally to voltage-to-current converters, and more specifically, to voltage-to-current converters configured to minimize current and output voltage reference error.

Background

Low-noise, low-power, wideband, and high-resolution digital-to-analog converters (DACs) are important for advanced wireless standards such as long term evolution (LTE). To support output power control of a power amplifier (PA), the full scale current of the DAC is required to be tuned from −18 dB to 0 dB with 1 dB/step accuracy. To achieve this precise current requirement for the DAC, a voltage-to-current converter in the DAC needs to be very stable and precise. However, the output voltage and current of a conventional voltage-to-current converter typically show large variations as well as inaccuracies due to the on-resistance variation across process-voltage-temperature (PVT) and the leakage current of switches in the voltage-to-current converter. This causes the output full current calibration of the DAC to be inaccurate and limits the DAC performance.

SUMMARY

The present invention provides for a reference-tag-tuning-based voltage-to-current converter in the DAC architecture configured to minimize the current error and the output voltage reference error due to gain setting switch leakage and on-resistance variation of the switches across process-voltage-temperature (PVT)

In one embodiment, a converter is disclosed. The converter includes: an amplifier having first and second input terminals and an output terminal, the first input terminal configured to receive a reference voltage; an array of resistors configured to generate a tuning voltage; and a first plurality of switches coupled to the second input terminal of the amplifier and the array of resistors, the first plurality of switches configured to adjust a gain of the amplifier by selecting at least one resistor in the array of resistors to connect to the second input terminal of the amplifier.

In another embodiment, an apparatus is disclosed. The apparatus includes: means for comparing first and second signals received at first and second input terminals, respectively, wherein the first signal is a reference voltage; and means for selecting and coupling at least one resistor in an array of resistors to the second input terminal of the means for comparing.

In another embodiment, a method is disclosed. The method includes: comparing first and second signals received at first and second input terminals, respectively, of an amplifier, wherein the first signal is a reference voltage; and selecting and coupling at least one resistor in an array of resistors to the second input terminal of the amplifier.

In a further embodiment, a voltage-to-current converter is disclosed. The voltage-to-current converter includes: an amplifier having positive and negative input terminals and an output terminal, the positive input terminal configured to receive a reference voltage; first, second, third, fourth, and fifth resistors configured to generate a tuning voltage; a first switch coupled to the negative input terminal of the amplifier and the first resistor, the first resistor coupled to the second resistor which is coupled to the ground voltage, wherein the tuning voltage is generated at a coupling node between the first resistor and the second resistor; a second switch coupled to the negative input terminal of the amplifier and the third resistor, which is coupled to the first resistor; a third switch coupled to the negative input terminal of the amplifier and the fourth resistor, which is coupled to the third resistor; and a fourth switch coupled to the negative input terminal of the amplifier and the fifth resistor, which is coupled to the fourth resistor.

Other features and advantages of the present invention should be apparent from the present description which illustrates, by way of example, aspects of the invention.

BRIEF DESCRIPTION OF THE DRAWINGS

The details of the present disclosure, both as to its structure and operation, may be gleaned in part by study of the appended further drawings, in which like reference numerals refer to like parts, and in which.

DETAILED DESCRIPTION

Certain embodiments as described herein provide for a reference-tag-tuning-based voltage-to-current converter in the DAC architecture configured to minimize the current error and the output voltage reference error due to gain setting switch leakage and on-resistance variation of the switches across process-voltage-temperature (PVT). The detailed description set forth below is intended as a description of exemplary designs of the present disclosure and is not intended to represent the only designs in which the present disclosure can be practiced. The term "exemplary" is used herein to mean "serving as an example, instance, or illustration." Any design described herein as "exemplary" is not necessarily to be construed as preferred or advantageous over other designs. The detailed description includes specific details for the purpose of providing a thorough understanding of the exemplary designs of the present disclosure. It will be apparent to those skilled in the art that the exemplary designs described herein may be practiced without these specific details. In some instances, well-known structures and devices are shown in block diagram form in order to avoid obscuring the novelty of the exemplary designs presented herein.

Figure 1:
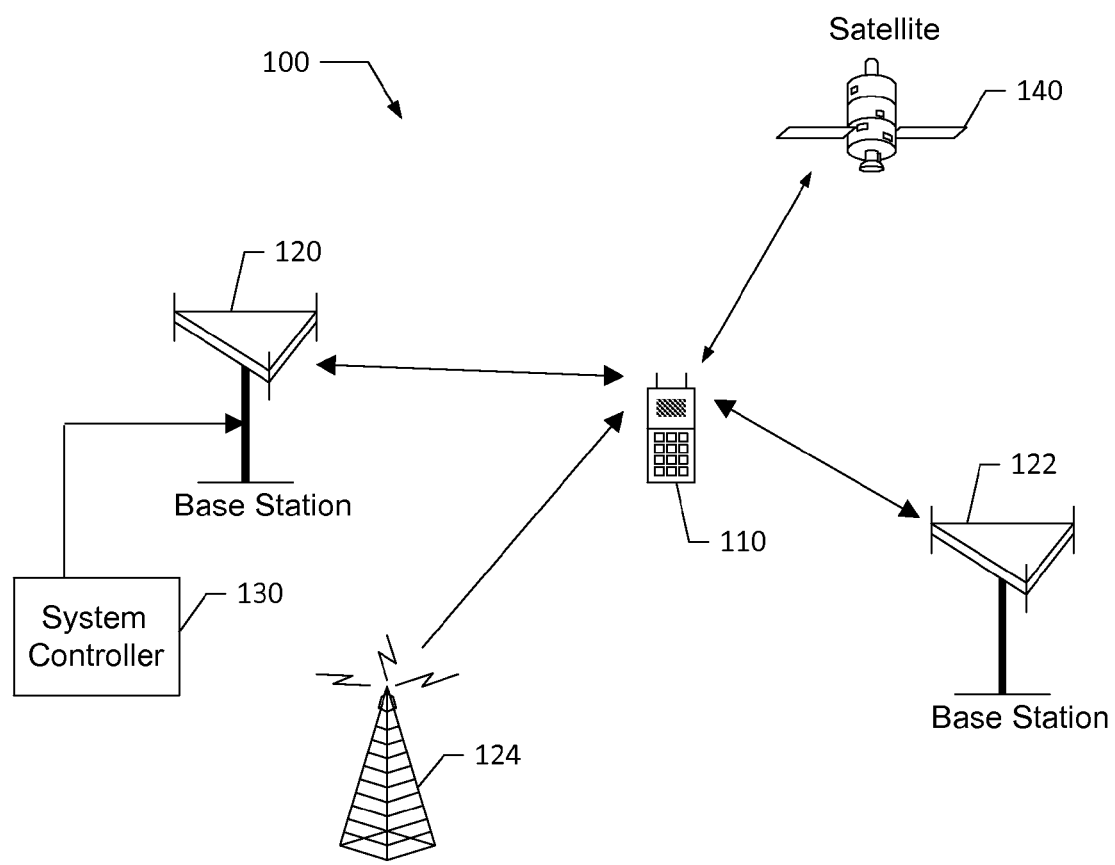
FIG. 1 is an exemplary wireless device communicating with a wireless communication system.

FIG. 1 is an exemplary wireless device 110 communicating with a wireless communication system 100. Wireless system 100 may be a Long Term Evolution (LTE) system, a Code Division Multiple Access (CDMA) system, a Global System for Mobile Communications (GSM) system, a wireless local area network (WLAN) system, or some other wireless system. A CDMA system may implement Wideband CDMA (WCDMA), CDMA 1X, Evolution-Data Optimized (EVDO), Time Division Synchronous CDMA (TD-SCDMA), or some other version of CDMA. For simplicity, FIG. 1 shows wireless system 100 including two base stations 120 and 122 and one system controller 130. In general, a wireless system may include any number of base stations and any set of network entities.

Wireless device 110 may also be referred to as a user equipment (UE), a mobile station, a terminal, an access terminal, a subscriber unit, a station, etc. Wireless device 110 may be a cellular phone, a smartphone, a tablet, a wireless modem, a personal digital assistant (PDA), a handheld device, a laptop computer, a smartbook, a netbook, a cordless phone, a wireless local loop (WLL) station, a Bluetooth device, etc. Wireless device 110 may communicate with wireless system 100. Wireless device 110 may also receive signals from broadcast stations (e.g., a broadcast station 124), signals from satellites (e.g., a satellite 140) in one or more global navigation satellite systems (GNSS), etc. Wireless device 110 may support one or more radio technologies for wireless communication such as LTE, WCDMA, CDMA 1X, EVDO, TD-SCDMA, GSM, 802.11, etc.

Figure 2:
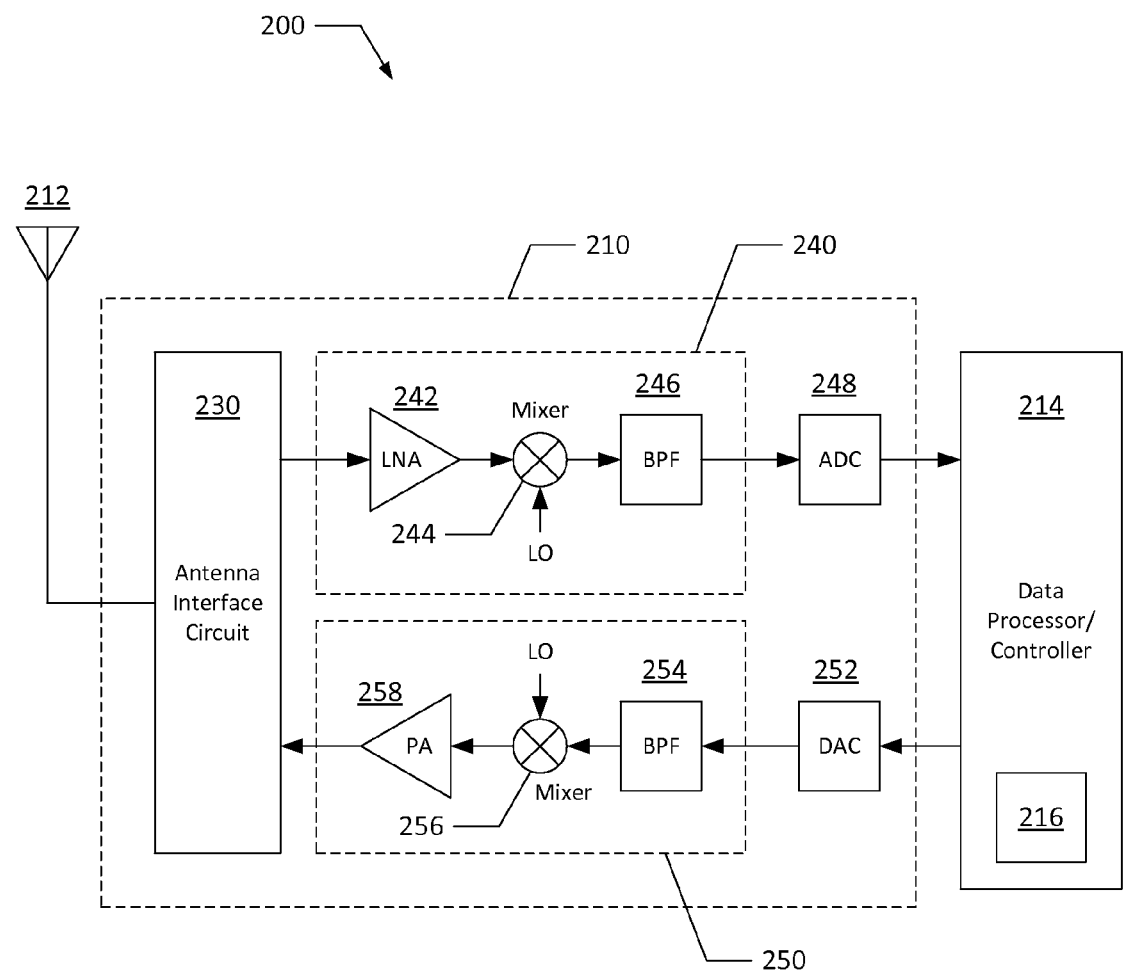
FIG. 2 is a block diagram of an exemplary design of wireless device that is one embodiment of wireless device of FIG. 1.

FIG. 2 is a block diagram of an exemplary design of wireless device 200 that is one embodiment of wireless device 110 of FIG. 1. In this exemplary design, wireless device 200 includes a transceiver 210 coupled to an antenna 212, and a data processor/controller 214. The transceiver 210 includes antenna interface circuit 230, a receiver path 240, and a transmitter path 250. Antenna interface circuit 230 may include switches, duplexers, transmit filters, receive filters, matching circuits, etc. Data processor/controller 214 may perform various functions for wireless device 200. For example, data processor 214 may perform processing for data being received via receiver path 240 and data being transmitted via transmitter path 250. Controller 214 may control the operation of the various circuits within the transceiver 210. Memory 216 may store program codes and data for data processor/controller 214. Data processor/controller 214 may be implemented on one or more application specific integrated circuits (ASICs) and/or other ICs. The receiver path 240 includes a low noise amplifier (LNA) 242, a mixer 244, and a bandpass filter 246. An analog-to-digital converter (ADC) 248 is placed subsequent to the bandpass filter 246 to digitize the baseband signal. The transmitter path 250 includes a bandpass filter 254, a mixer 256, and a power amplifier (PA) 258. A digital-to-analog converter (DAC) 252 is placed between the data processor/controller 214 and the bandpass filter 254 to convert the digital data to the analog baseband signal.

For data reception, antenna 212 receives signals from base stations and/or other transmitter stations and provides a received RF signal, which is routed through an antenna interface circuit 230 and presented as an input RF signal to the receiver path 240. Within the receiver path 240, the LNA 242 amplifies the input RF signal and provides an output RF signal to the mixer 244. The mixer 244 and the bandpass filter 246 downconvert the output RF signal from RF to baseband, amplify and filter the downconverted signal, and provide an analog input signal to the ADC 248. The ADC 248 converts the analog input signal to the digital data and provides the digital data to the data processor/controller 214. The receiver path 240 may include other elements such as matching circuits, an oscillator, a local oscillator (LO) generator, a phase locked loop (PLL), etc.

For data transmission, the data processor/controller 214 processes (e.g., encodes and modulates) data to be transmitted and provides a digital data to the DAC 252. The DAC 252 converts the digital data to an analog output signal and provides the converted analog output signal to the transmitter path 250. Within the transmitter path 250, the bandpass filter 254 and the mixer 256 amplify, filter, and upconvert the analog output signal from baseband to RF and provide a modulated RF signal. The transmitter path 250 may include other elements such as matching circuits, an oscillator, an LO generator, a PLL, etc. The PA 258 receives and amplifies the modulated RF signal and provides a transmit RF signal having the proper output power level. The transmit RF signal is routed through antenna interface circuit 230 and transmitted via antenna 212.

Figure 3:
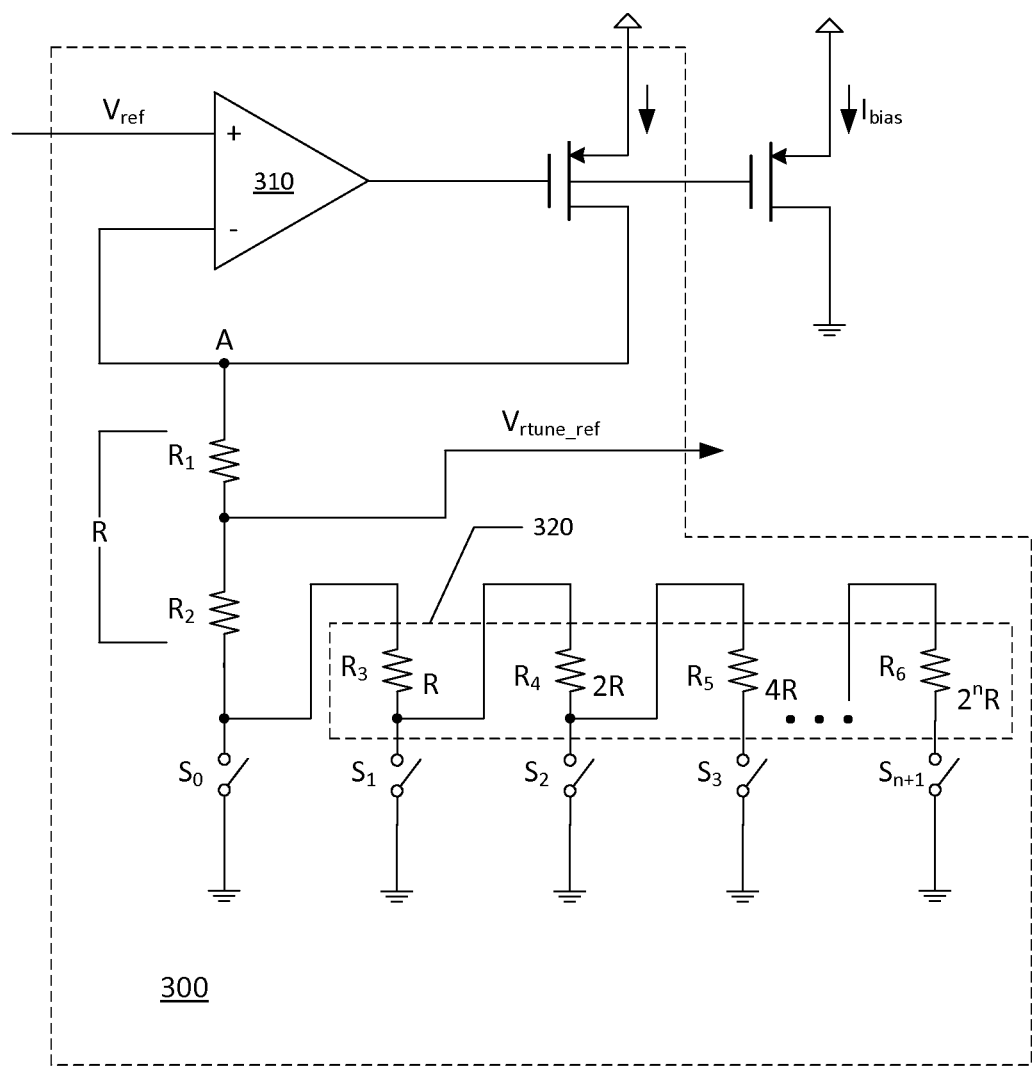
FIG. 3 is a schematic diagram of a typical implementation of a voltage-to-current converter block.

FIG. 3 is a schematic diagram of a typical implementation of a voltage-to-current converter block 300. In FIG. 3, a reference voltage ($V_{ref}$) from the power management integrated circuit (PMIC) is supplied to a positive input of an amplifier 310 which operates to maintain the voltage at the negative input (at node A) to be the same as $V_{ref}$ at the positive input. An array of resistors 320 is used to tune the output current ($I_{bias}$). A plurality of switches $S_0$ to $S_{n+1}$ allows each resistor in the array of resistors 320 to be applied for tuning. In one embodiment, the switches are configured with CMOS transistors.

To tune the full range of the output current of the DAC from −18 dB to 0 dB in 6 dB increments, for example, resistors $R_3$, $R_4$, and $R_5$ are needed from the resistor array 320. Further, switches $S_0$, $S_1$, $S_2$, and $S_3$ allow the resistors to be applied for tuning. For example, when switch $S_0$ is closed (and all other switches are open), the tuning voltage ($V_{rtune\_ref}$) is equal to $V_{ref}*(R_2/R_{TOTAL})$, where $R_{TOTAL}=R_1+R_2$ and $I_{bias}=V_{ref}/R_{TOTAL}$. In another example, when switch $S_1$ is closed (and all other switches are open), the tuning voltage ($V_{rtune\_ref}$) is equal to $V_{ref}*((R_2+R_3)/R_{TOTAL})$, where $R_{TOTAL}=R_1+R_2+R_3$ and $I_{bias}=V_{ref}R_{TOTAL}$. Thus, the tuning voltage is set according to the ratio of the resistor array (according to the configurations of the switches). Generalizing the above examples, Equations (1), (2), and (3) for parameters $V_{rtune\_ref}$, $I_{bias}$, and $R_{TOTAL}$, respectively, using ideal switches are as follows:

$$V_{tune\_ref} = \frac{R_2}{R_{TOTAL}} * V_{ref} \qquad (1)$$

$$I_{bias} = \frac{V_{ref}}{R_{TOTAL}} \qquad (2)$$

$$R_{TOTAL} = R + a_0 R + a_1 2R + a_2 4R + \ldots + a_n 2^n R \qquad (3)$$

Constants $a_0, a_1, a_2, \ldots a_n$ are each set to 0 or 1 depending on the gain setting code for switches $S_1, S_2, S_3, \ldots, S_{n+1}$.

However, as stated above, the non-ideal switches (e.g., switches $S_1, S_2, S_3, \ldots, S_{n+1}$) used in the configuration shown in FIG. 1 can exhibit on-resistance variations across PVT and cause the leakage of current during off states. These variations can cause the output voltage and current to vary with PVT. These variations modify above Equations (1) and (2) as follows:

$$V_{tune\_ref} = \frac{R_2}{R_{TOTAL}} * (V_{ref} - V_{ron0}) + V_{ron0} \tag{4}$$

$$I_{bias} = \frac{V_{ref} - b_0 V_{ron0} - b_1 V_{ron1} - b_2 V_{ron2} - b_3 V_{ron3} \ldots - b_{n+1} V_{ron,n+1}}{R_{TOTAL}} + I_{leakage} \tag{5}$$

where $V_{ron_0}, V_{ron_1}, V_{ron_2}, V_{ron_3}, \ldots, V_{ron,n+1}$ are voltage drops across switches $S_1, S_2, S_3, \ldots, S_{n+1}$ when the switches are on, and $I_{leakage}$ is the total leakage current of the switches when the switches are in off states. Constants $b_0, b_1, b_2, \ldots b_{n+1}$ are each set to 0 or 1 depending on the gain setting code for switches $S_1, S_2, S_3, \ldots, S_{n+1}$.

Thus, it can be seen from the above equations that both the output reference voltage and the bias current have been affected by the switch on-voltage drop and the leakage current. Further, due to the mismatch between the sizes of the switches, the on-voltage drops $V_{ron_0}, V_{ron_1}, V_{ron_2}, V_{ron_3}, \ldots, V_{ron,n+1}$ may not be same, which may cause the tuning ratios (equal to 6 dB using resistors $R_3, R_4, R_5$) to be inaccurate.

Figure 4:
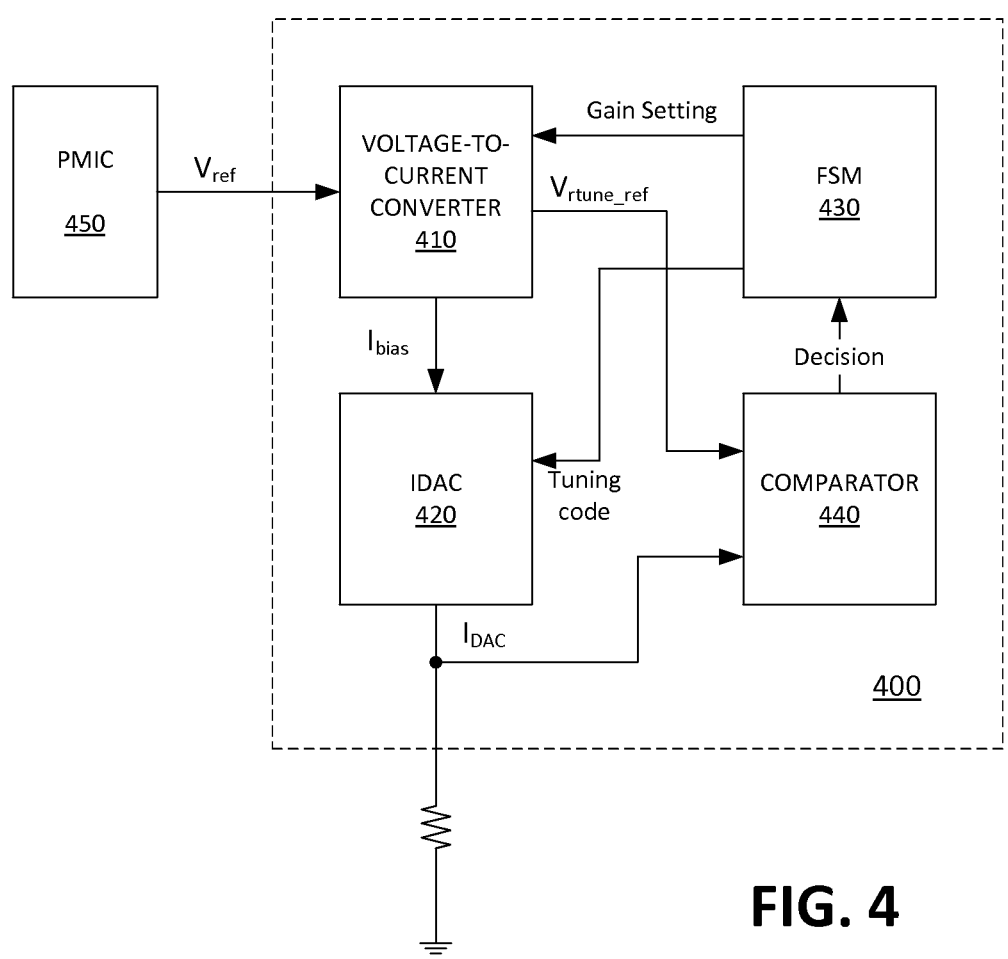
FIG. 4 is a functional block diagram of a digital-to-analog converter (DAC) in accordance with one embodiment of the present disclosure.

FIG. 4 is a functional block diagram of a digital-to-analog converter (DAC) 400 in accordance with one embodiment of the present disclosure. In one embodiment, the DAC 400 is configured to be used in a transmitter for supporting the output power control of a power amplifier having a precise current requirement, which is achieved by an accurate voltage reference ($V_{ref}$) received from the power management integrated circuit (PMIC) 450. Thus, the DAC 400 can be configured as one embodiment of a DAC 252 of the transceiver 210 shown in FIG. 2.

In the illustrated embodiment of FIG. 4, The DAC 400 includes a voltage-to-current converter 410, a tuning current DAC 420, a finite state machine (FSM) 430, and a comparator 440. The voltage-to-current converter 410 is configured to generate an accurate tuned voltage reference ($V_{rtune\_ref}$) to calibrate the output current to a preset value (using the comparator 440 and the FSM 430) and generate an updated bias current for the tuning current DAC 420 which provides accurate bias current steps (e.g., a 6 dB step). The comparator 440 receives and compares the tuning voltage ($V_{rtune\_ref}$) and the output current of the tuning current DAC 420 and outputs a decision to the FSM 430, which generates a gain setting code and a tuning code based on the decision received from the comparator 440. The gain setting code is sent to the voltage-to-current converter 410 and the tuning code is sent to the tuning current DAC 420.

Figure 5:
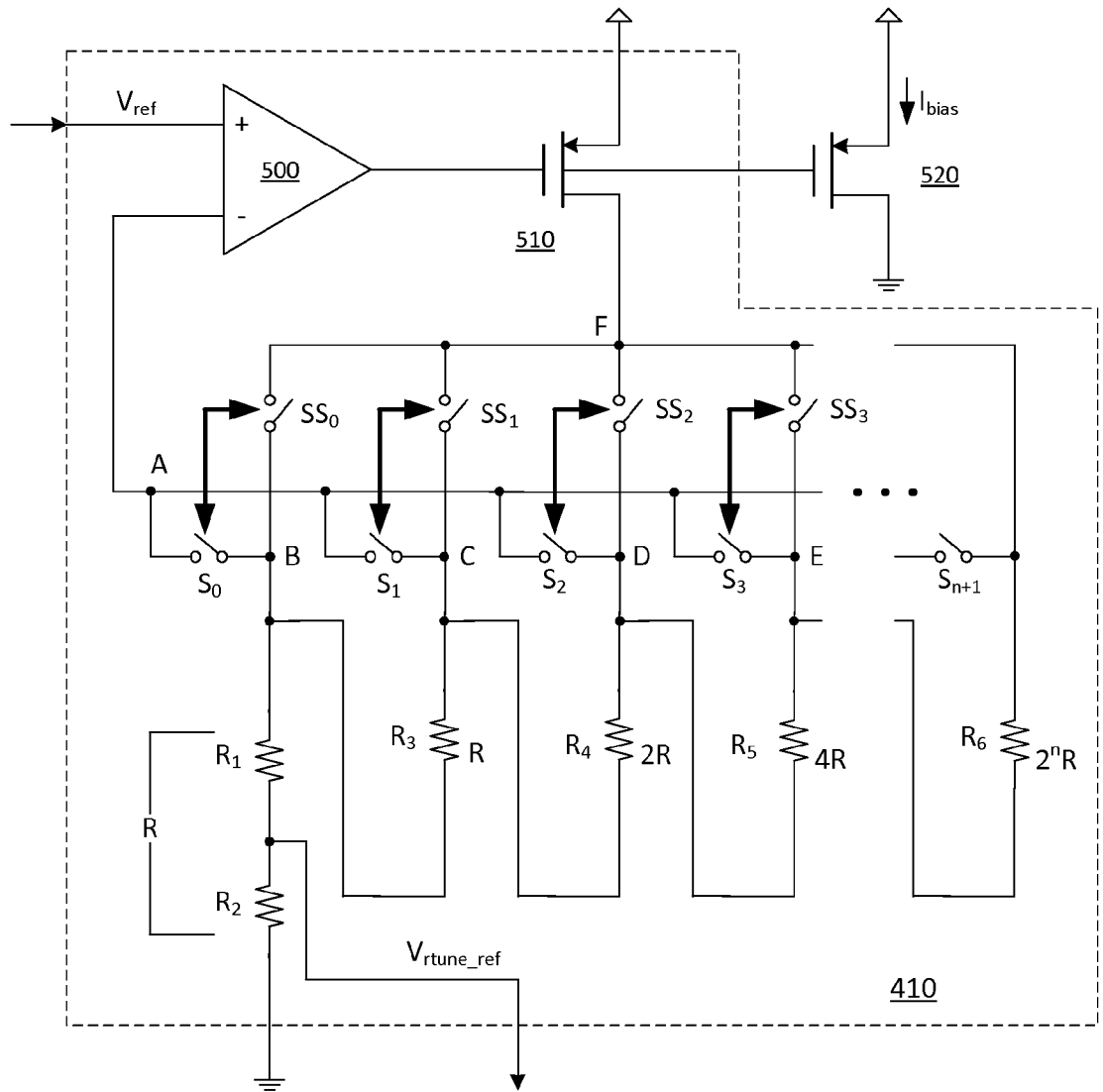
FIG. 5 is a schematic diagram of a voltage-to-current converter in accordance with one embodiment of the present disclosure.

FIG. 5 is a schematic diagram of a voltage-to-current converter 410 in accordance with one embodiment of the present disclosure. In the illustrated embodiment of FIG. 5, the voltage-to-current converter 410 includes an amplifier 500, a current regulating transistor 510, an array of resistors $R_1$ to $R_6$, gain setting switches $S_0$ to $S_{n+1}$, and short switches $SS_0$ to $SS_3$. The output current can be mirrored to a current mirror transistor 520. In one embodiment, the current regulating transistor 510 is configured as a p-type metal-oxide-semiconductor field-effect (PMOS) transistor, and the mirror transistor 520 is also configured as a PMOS transistor. In another embodiment, the current regulating transistor 510 and the mirror transistor 520 can be configured as any combination of PMOS and NMOS transistors.

To address the on-resistance variations across PVT and the leakage of current during off states in the configuration of FIG. 3, the voltage-to-current converter 410 shown in FIG. 5 is configured to move the gain setting switches $S_1, S_2, S_3, \ldots, S_{n+1}$ to the negative input side (at node A) of the amplifier 500. Thus, in this configuration, the gain is set by setting select switches to appropriate positions to couple the selected resistor(s) of the resistor array to the negative input side of the amplifier 500. For example, by closing switch $S_0$ and opening all other switches, the total resistance coupled to node A is equal to $R_1+R_2$. In another example, by closing switch $S_1$ and opening all other switches, the total resistance coupled to node A is equal to $R_1+R_2+R_3$. In yet another example, by closing switch $S_2$ and opening all other switches, the total resistance coupled to node A is equal to $R_1+R_2+R_3+R_4$, and so on. Thus, by changing the tuning tag position, the resistance value from the negative input of the amplifier 500 to ground can be changed so that the output current can be changed. An advantage of this configuration of switches is that since the input of the amplifier 500 couples to the gate of a transistor (typically a CMOS transistor), the input (at node A) can be regarded as an open terminal, and the amount of current flow from or into the on-switch is very minimal, if any. Therefore, the voltage drop across the on-switch is negligible and the tag voltage on the resistor array can be made accurate as shown in Equation (6):

$$V_{tune\_ref} = \frac{R_2}{R_{TOTAL}} * V_{ref} \tag{6}$$

In the illustrated embodiment of FIG. 5, short switches $SS_0, SS_1, SS_2, SS_3$ are added and coupled between the drain terminal of the transistor 510 and nodes B, C, D, E to keep enough headroom for the current source (including the current regulating transistor 510). The short switches $SS_0, SS_1, SS_2, SS_3$ are operated in synchronization with the gain setting switches $S_1, S_2, S_3, \ldots, S_{n+1}$ to short the unused resistors and keep enough headroom for the current source. For example, when switch $S_0$ is closed, short switch $SS_0$ is also closed. This shorts resistors $R_3$ through $R_6$. In another example, when switch $S_1$ is closed, short switch $SS_1$ is also closed. This shorts resistors $R_4$ through $R_6$. In yet another example, when switch $S_2$ is closed, short switch $SS_2$ is also closed. This shorts resistors $R_5$ through $R_6$, and so on. However, the short switches do not need to have very small on-resistance since the output current is not related to the variation on the drain terminal of the transistor 510. That is, although when short switch $SS_0, SS_1, SS_2$, or $SS_3$ is closed, node F should be as close as possible to node B, C, D, or E, the voltage difference between node F and node B, C, D, or E can be as large as 20 mV of each other without adversely affecting the level of the output current. Accordingly, the size of switches $SS_0, SS_1, SS_2, SS_3$ can be minimal which reduces the area occupied on a chip. Equation (7) shows the formula for output bias current ($I_{bias}$) which adds a leakage current of the short switches to the bias current calculated in Equation (2) as follows:

$$I_{bias} = \frac{V_{ref}}{R_{TOTAL}} \qquad (7)$$

Figure 6:
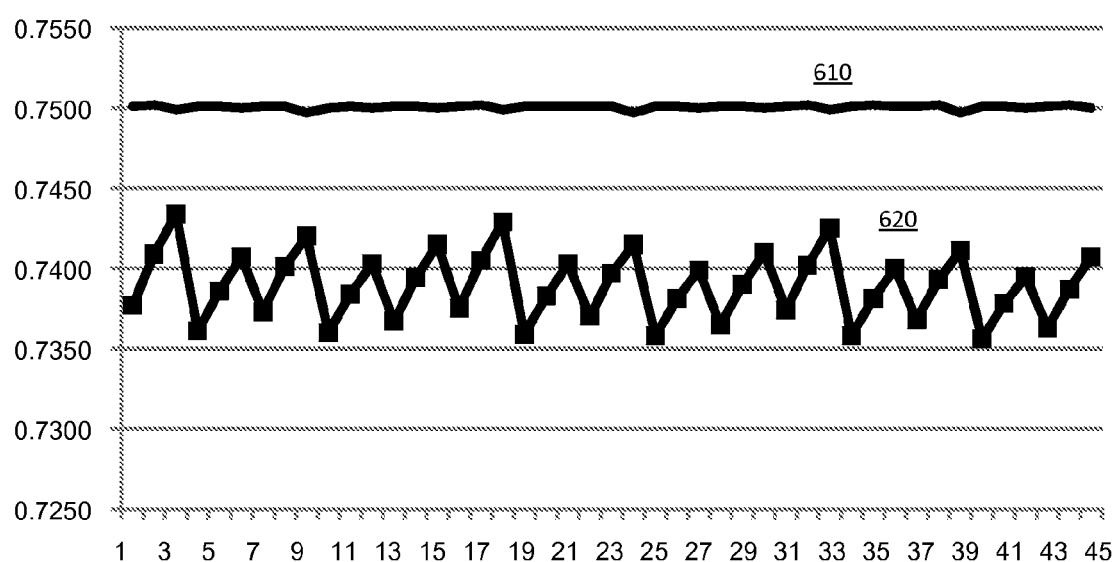
FIG. 6 is a comparison plot of tuning reference voltages ($V_{rtune\_ref}$) of a typical implementation shown in FIG. 3 versus an improved implementation shown in FIG. 5 across PVT variations.

FIG. 6 is a comparison plot 600 of tuning reference voltages ($V_{rtune\_ref}$) of a typical implementation shown in FIG. 3 versus an improved implementation shown in FIG. 5 across PVT variations. Plot 620 is $V_{rtune\_ref}$ of the typical implementation, while plot 610 is $V_{rtune\_ref}$ of the improved implementation. The improved implementation of FIG. 5 shows a more stable voltage level for $V_{rtune\_ref}$ which closely tracks the 0.75 volt of the reference voltage ($V_{ref}$).

Further, Table 1 shown below summarizes the reference voltage variation across device mismatch for the two implementations shown in FIG. 3 and FIG. 5. Table 1 shows the Monte Carlo simulation to compare $V_{rtune\_ref}$ of the voltage-to-current converters shown in FIG. 3 and FIG. 5. It can be seen from the table that the improved implementation shows a smaller standard deviation for $V_{rtune\_ref}$.

TABLE 1

Reference Voltage Comparison in Monte Carlo Simulation of V2I block (200 runs, 50° C.)

| Type | Min | Max | Mean | Sigma | Unit |
|---|---|---|---|---|---|
| $V_{rtune\_ref}$ in FIG. 3 | 738.7 | 744.4 | 741.1 | 0.9945 | mV |
| $V_{rtune\_ref}$ in FIG. 5 | 748.9 | 751.1 | 749.9 | 0.3789 | mV |

Figure 7:
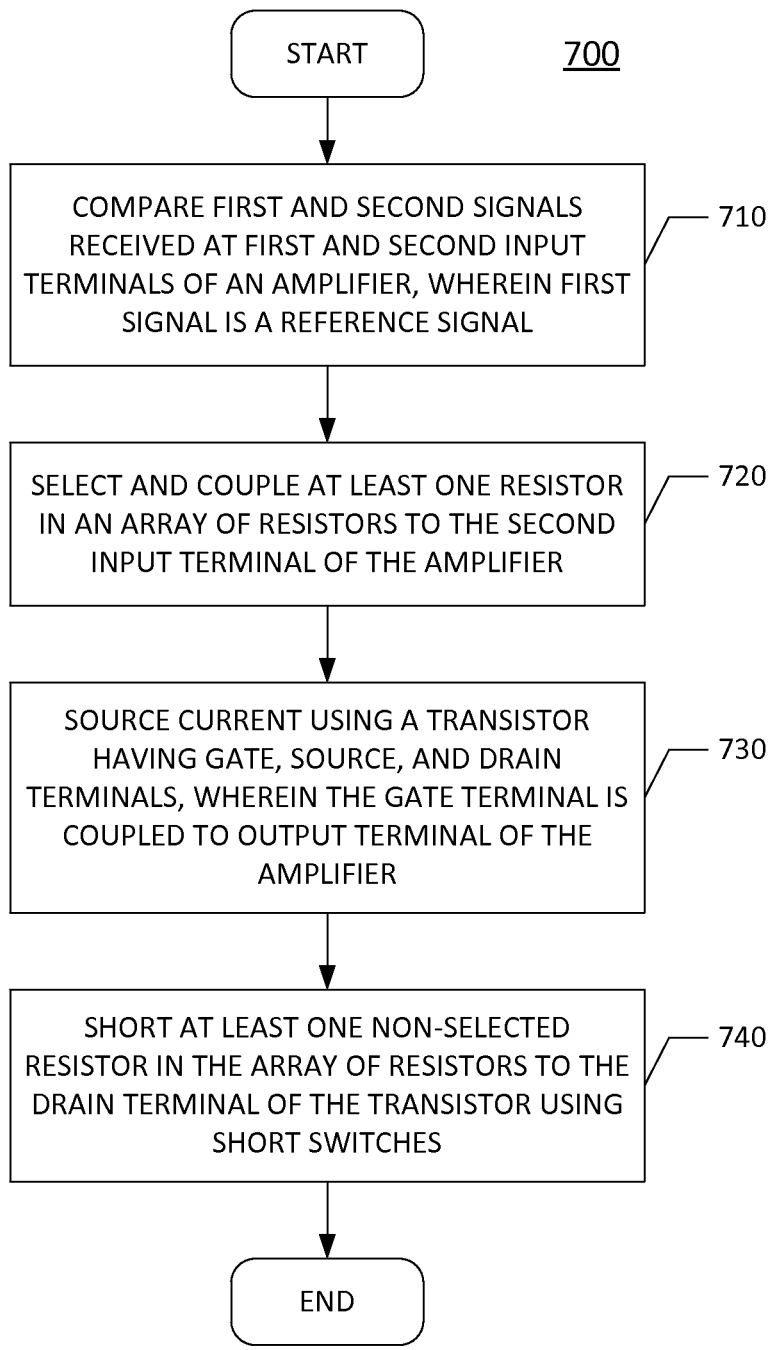
FIG. 7 is a flow diagram of an exemplary method for converting voltage to current in accordance with one embodiment of the present disclosure.

FIG. 7 is a flow diagram of an exemplary method 700 for converting voltage to current in accordance with one embodiment of the present disclosure. The method 700 is suitable for use with a voltage-to-current converter (e.g., 410 in FIG. 4) including an amplifier (e.g., 500 in FIG. 5), a current regulating transistor (e.g., 510 in FIG. 5), an array of resistors, (e.g., $R_1$ to $R_6$ in FIG. 5), a plurality of gain setting switches (e.g., $S_0$ to $S_{n+1}$ in FIG. 5), and a plurality of short switches (e.g., $SS_0$ to $SS_3$ in FIG. 5).

In the illustrated embodiment of FIG. 7, first and second signals are received at first and second input terminals, respectively, of an amplifier, at block 710. In one embodiment, the first signal is a reference voltage. At block 720, at least one resistor is selected from an array of resistors and coupled to the second input terminal of the amplifier. Current is sourced, at block 730, using a transistor having a gate terminal, a source terminal, and a drain terminal. The gate terminal is coupled to the output terminal of the amplifier. At least one non-selected resistor in the array of resistors is shorted, at block 740, to the drain terminal of the transistor.

Figure 8:
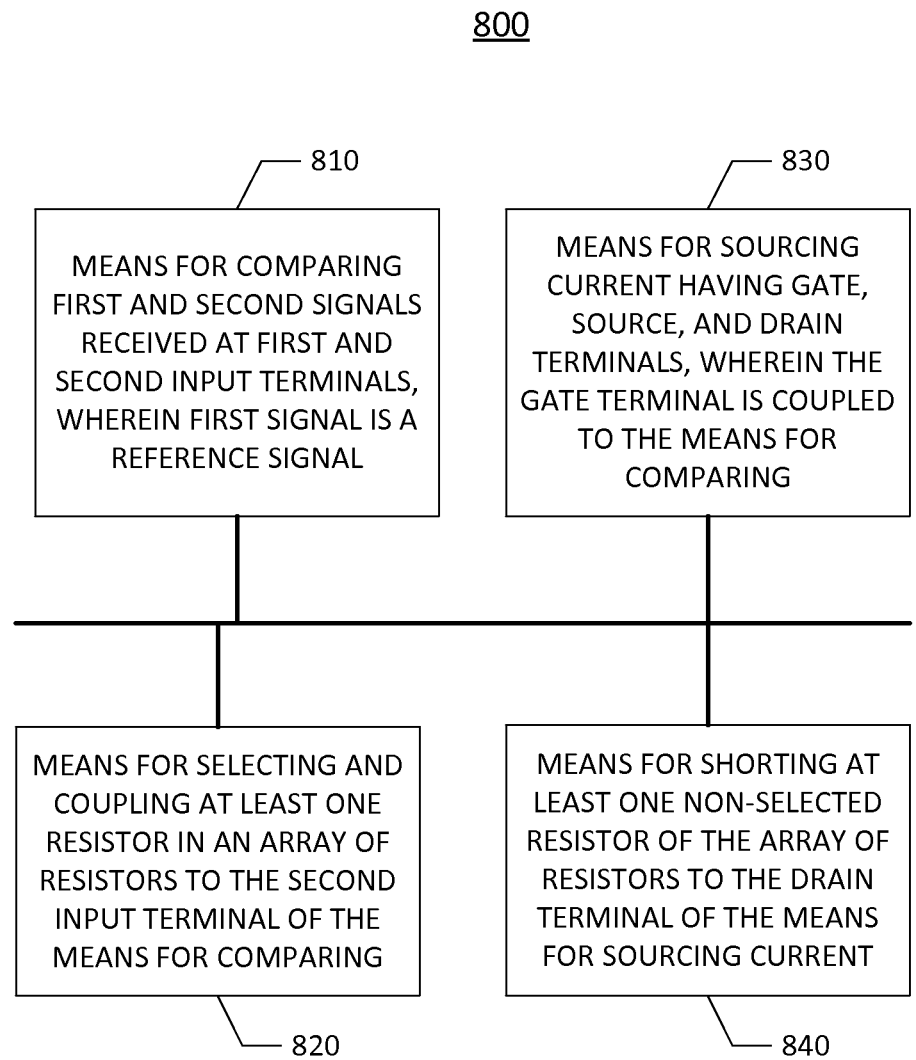
FIG. 8 is a functional block diagram of an exemplary apparatus configured for converting voltage to current in accordance with one embodiment of the present disclosure.

FIG. 8 is a functional block diagram of an exemplary apparatus 800 configured for converting voltage to current in accordance with one embodiment of the present disclosure. In the illustrated embodiment of FIG. 8, the apparatus 800 comprises a first means 810 for comparing first and second signals received at first and second input terminals, wherein the first signal is a reference signal. The apparatus 800 also includes a second means 820 for selecting and coupling at least one resistor in an array of resistors to the second input terminal of the means for comparing 810 using gain setting switches. The apparatus 800 also includes a third means 830 for sourcing current having a gate terminal, a source terminal, and a drain terminal. The gate terminal is coupled to the output terminal of the means for comparing. The apparatus 800 further includes a fourth means 840 for shorting at least one non-selected resistor in the array of resistors to the drain terminal of the means for sourcing current.

Although several embodiments of the present disclosure are described above, many variations of the present disclosure are possible. For example, although the illustrated embodiments described above configure the voltage-to-current converter for a digital-to-analog converter, the voltage-to-converter described above can be configured for other electronic circuits such as filters and loads. Further, features of the various embodiments may be combined in combinations that differ from those described above. Moreover, for clear and brief description, many descriptions of the systems and methods have been simplified. Many descriptions use terminology and structures of specific standards. However, the disclosed systems and methods are more broadly applicable.

Those of skill will appreciate that the various illustrative blocks and modules described in connection with the embodiments disclosed herein can be implemented in various forms. Some blocks and modules have been described above generally in terms of their functionality. How such functionality is implemented depends upon the design constraints imposed on an overall system. Skilled persons can implement the described functionality in varying ways for each particular application, but such implementation decisions should not be interpreted as causing a departure from the scope of the present disclosure. In addition, the grouping of functions within a module, block, or step is for ease of description. Specific functions or steps can be moved from one module or block without departing from the present disclosure.

The various illustrative logical blocks, units, steps, components, and modules described in connection with the embodiments disclosed herein can be implemented or performed with a processor, such as a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor can be a microprocessor, but in the alternative, the processor can be any processor, controller, microcontroller, or state machine. A processor can also be implemented as a combination of computing devices, for example, a combination of a DSP and a microprocessor, a plurality of microprocessors, one or more microprocessors in conjunction with a DSP core, or any other such configuration. Further, circuits implementing the embodiments and functional blocks and modules described herein can be realized using various transistor types, logic families, and design methodologies.

The above description of the disclosed embodiments is provided to enable any person skilled in the art to make or use the invention described in the present disclosure. Various modifications to these embodiments will be readily apparent to those skilled in the art, and the generic principles described herein can be applied to other embodiments without departing from the spirit or scope of the present disclosure. Thus, it is to be understood that the description and drawings presented herein represent presently preferred embodiments of the present disclosure and are therefore representative of the subject matter which is broadly contemplated by the present disclosure. It is further understood that the scope of the present disclosure fully encompasses other embodiments that may become obvious to those skilled in the art and that the scope of the present disclosure is accordingly limited by nothing other than the appended claims.

The invention claimed is:

1. A converter comprising:
   an amplifier having first and second input terminals and an output terminal, the first input terminal configured to receive a reference voltage, wherein the first input terminal of the amplifier is a positive input terminal and the second input terminal is a negative input terminal;
   an array of resistors configured to generate a tuning voltage;
   a first plurality of switches coupled to the second input terminal of the amplifier and the array of resistors, the first plurality of switches configured to adjust a gain of the amplifier by selecting at least one resistor in the array of resistors to connect to the second input terminal of the amplifier;
   a tuning current digital-to-analog converter configured to generate an output current; and
   a comparator configured to receive and compare the tuning voltage and the output current.

2. The converter of claim 1, further comprising
   a first transistor having a gate terminal, a source terminal, and a drain terminal,
   wherein the output terminal of the amplifier is coupled to the gate terminal of the transistor.

3. The converter of claim 2, wherein the first transistor is a p-type metal-oxide-semiconductor field-effect (PMOS) transistor.

4. The converter of claim 3, further comprising
   a second plurality of switches coupled to the first plurality of switches and the drain terminal of the PMOS transistor.

5. The converter of claim 4, wherein the second plurality of switches are configured to short at least one non-selected resistor in the array of resistors to the drain terminal of the first transistor.

6. The converter of claim 4, wherein the first plurality of switches and the second plurality of switches are operated in synchronization.

7. The converter of claim 4, wherein the first plurality of switches and the second plurality of switches are configured to program the array of resistors to provide a second voltage at the second input terminal of the amplifier.

8. The converter of claim 7, wherein the second voltage at the second input terminal of the amplifier enables the amplifier to regulate current flowing through the first transistor.

9. The converter of claim 1, wherein a connection of the at least one selected resistor in the array of resistors to the second input terminal of the amplifier is configured as an open terminal to minimize current flow from or into the first plurality of switches.

10. An apparatus comprising:
    means for comparing first and second signals received at first and second input terminals, respectively, wherein the first signal is a reference voltage;
    means for selecting and coupling at least one resistor in an array of resistors to the second input terminal of the means for comparing;
    means for sourcing current having a gate terminal, a source terminal, and a drain terminal, wherein the gate terminal of the means for sourcing current is coupled to the means for comparing; and
    means for shorting at least one non-selected resistor of the array of resistors to the drain terminal of the means for sourcing current.

11. The apparatus of claim 10, wherein the means for selecting and coupling and the means for shorting are operated in synchronization.

12. The apparatus of claim 10, wherein the means for selecting and coupling and the means for shorting are configured to program the array of resistors to provide a second voltage at the second input terminal of the means for comparing.

13. The apparatus of claim 12, wherein the second voltage at the second input terminal of the means for comparing enables the means for comparing to regulate current flowing through the means for sourcing current.

14. A method, comprising:
    comparing first and second signals received at first and second input terminals, respectively, of an amplifier, wherein the first signal is a reference voltage;
    selecting and coupling at least one resistor in an array of resistors to the second input terminal of the amplifier;
    sourcing current using a transistor having a gate terminal, a source terminal, and a drain terminal, wherein the gate terminal of the transistor is coupled to an output terminal of the amplifier; and
    shorting at least one non-selected resistor of the array of resistors to the drain terminal of the transistor using a plurality of short switches.

15. A voltage-to-current converter comprising:
    an amplifier having positive and negative input terminals and an output terminal, the positive input terminal configured to receive a reference voltage;
    first, second, third, fourth, and fifth resistors configured to generate a tuning voltage;
    a first switch coupled to the negative input terminal of the amplifier and the first resistor, the first resistor coupled to the second resistor which is coupled to the ground voltage, wherein the tuning voltage is generated at a coupling node between the first resistor and the second resistor;
    a second switch coupled to the negative input terminal of the amplifier and the third resistor, which is coupled to the first resistor;
    a third switch coupled to the negative input terminal of the amplifier and the fourth resistor, which is coupled to the third resistor; and
    a fourth switch coupled to the negative input terminal of the amplifier and the fifth resistor, which is coupled to the fourth resistor.

16. The voltage-to-current converter of claim 15, further comprising
    a first transistor having a gate terminal, a source terminal, and a drain terminal,
    wherein the output terminal of the amplifier is coupled to the gate terminal of the transistor.

17. The voltage-to-current converter of claim 16, further comprising:
    a fifth switch coupled to the first switch and the drain terminal of the first transistor;
    a sixth switch coupled to the second switch and the drain terminal of the first transistor; and
    a seventh switch coupled to the third switch and the drain terminal of the first transistor, wherein the fourth switch also couples to the drain terminal of the first transistor.

* * * * *